United States Patent
Hsu et al.

(10) Patent No.: US 9,997,672 B2
(45) Date of Patent: Jun. 12, 2018

(54) ELECTRODE STRUCTURE OF LIGHT EMITTING DIODE

(71) Applicant: TEKCORE CO., LTD., Nantou (TW)

(72) Inventors: Hai-Wen Hsu, Nantou (TW); Jia-Hong Sun, Nantou (TW)

(73) Assignee: TEKCORE CO., LTD., Nantou (TW)

( * ) Notice: Subject to any disclaimer, the term of this patent is extended or adjusted under 35 U.S.C. 154(b) by 0 days. days.

(21) Appl. No.: 15/286,056

(22) Filed: Oct. 5, 2016

(65) Prior Publication Data
US 2018/0097148 A1    Apr. 5, 2018

(51) Int. Cl.
| | |
|---|---|
| H01L 33/00 | (2010.01) |
| H01L 33/38 | (2010.01) |
| H01L 33/40 | (2010.01) |
| H01L 33/62 | (2010.01) |

(52) U.S. Cl.
CPC ............ *H01L 33/387* (2013.01); *H01L 33/40* (2013.01); *H01L 33/62* (2013.01)

(58) Field of Classification Search
CPC combination set(s) only.
See application file for complete search history.

(56) References Cited

U.S. PATENT DOCUMENTS

2015/0287602 A1 * 10/2015 Gaska .................. H01L 21/283
438/46

FOREIGN PATENT DOCUMENTS

TW        I497767 B      8/2015

* cited by examiner

*Primary Examiner* — Thomas L Dickey
(74) *Attorney, Agent, or Firm* — Muncy, Geissler, Olds & Lowe, P.C.

(57) ABSTRACT

An electrode structure of an LED includes an adhesion layer and a bond pad layer. The adhesion layer is stacked on the LED. The bond pad layer is stacked on the adhesion layer. The bond pad layer includes at least two first metal layers, at least two second metal layers and an outermost gold layer sequentially and alternately stacked. The first metal layers are selected from the group consisting Al and an Al alloy, and the second metal layers are selected from the group consisting of Ti, Ni, Cr, Pt, Pd, TiN, TiW, W, Rh and Cu. Thus, the main structure of the bond pad layer is a stacked structure of the first metal layers and the second metal layers. The first metal layers may be selected from a low-cost material, and the second metal layers improve issues of inadequate hardness and electromigration of the first metal layers.

6 Claims, 5 Drawing Sheets

ELECTRODE STRUCTURE OF LIGHT EMITTING DIODE

FIELD OF THE INVENTION

The present invention relates to a light emitting diode (LED), and particularly to an electrode structure of an LED.

BACKGROUND OF THE INVENTION

A light emitting diode (LED) is mainly formed by light emitting semiconductor material multi-epitaxy. Take a blue light LED for example. A blue light LED is manly formed by GaN-based epitaxial films, and a main structure includes a sandwiched light emitting body stacked from an N-type semiconductor layer, a light emitting layer, and a P-type semiconductor layer. LEDs, based on their structures, are categorized into horizontal, vertical and flip-chip types, with a main structure including an N-type semiconductor layer, a light emitting layer and a P-type semiconductor layer. An LED is capable of converting electric energy to light. In order to input electric energy to the light emitting body of an LED, two electrode structures, respectively electrically connected to the N-type semiconductor layer and the P-type semiconductor layer, need to be provided on the light emitting body.

FIG. 1 shows an electrode structure of a conventional LED, which mainly includes an adhesion layer 1 and a bond pad layer 2. The adhesion layer 1 includes a chromium layer 1A (18 angstroms (Å)), a first metal layer 1B (2500 Å) and a second metal layer 1C (500 Å). The bond pad layer 2 includes a platinum layer 2A (400 Å) and a gold layer 2B (18000 Å). The bond pad layer 2 serves for wire bonding purposes, and its gold layer 2B needs to have a thickness of 18000 Å in order to satisfy requirements of adequate wire bonding hardness and reduced electromigration. It is apparent that the amount of gold used is quite large. One reason for such is that, aluminum has inadequate hardness that cannot be readily used for wire bonding and produces electromigration under large-current operations. However, as the cost of gold is far greater than that of aluminum, production costs resulted are high.

Given that optoelectronic characteristics of an LED are not affected (or similar effects are achieved), in order to reduce production costs, one current development trend is replacing gold by other materials. For example, the Taiwan Patent No. I497767, replaces aluminum by an aluminum alloy to solve the electromigration produced under large-current operations. However, characteristics of an aluminum alloy are still quite similar to those of aluminum; that is, the hardness requirement for wire bonding is not exactly satisfied, nor is the issue of electromigration reliably solved.

SUMMARY OF THE INVENTION

Therefore, it is a primary object of the present invention to disclose an electrode structure for reducing the amount of gold used to save costs.

The present invention provides an electrode structure of a light emitting diode (LED). The electrode structure is applied to an LED, and includes an adhesion layer and a bond pad layer. The adhesion layer is stacked on the LED, and the bond pad layer is stacked on the adhesion layer. The electrode structure is characterized that, the bond pad layer includes at least two first metal layers, at least two second metal layers and an outermost gold layer that are sequentially and alternately stacked. The first metal layers are selected from the group consisting of aluminum (Al) and an aluminum alloy. The second metal layers are selected from the group consisting of titanium (Ti), nickel (Ni), chromium (Cr), platinum (Pt), palladium (Pd), titanium nitride (TiN), titanium wolfram (TiW), wolfram (W), rhodium (Rh) and copper (Cu).

Accordingly, the main structure of the bond pad layer of the present invention is a stacked structure of the first metal layers and the second metal layers. The first metal layers are selected from the group consisting of Al and an aluminum alloy, which have lower costs. The second metal layers are selected from the group consisting of Ti, Ni, Cr, Pt, Pd, TiN, TiW, W, Rh and Cu, which have greater hardness for improving issues of the inadequate hardness for wire bonding and electromigration of the first metal layers, and significantly reduce the amount of gold used. As opposed to a conventional structure, the electrode structure of the present invention reduces production costs to satisfy manufacturing needs.

DETAILED DESCRIPTION OF THE PREFERRED EMBODIMENTS

Details and technical contents of the present invention are given in embodiments with the accompanying drawings below. It should be noted that, these embodiments are for illustrations and are not to be construed as limitations to the present invention.

Figure 2:
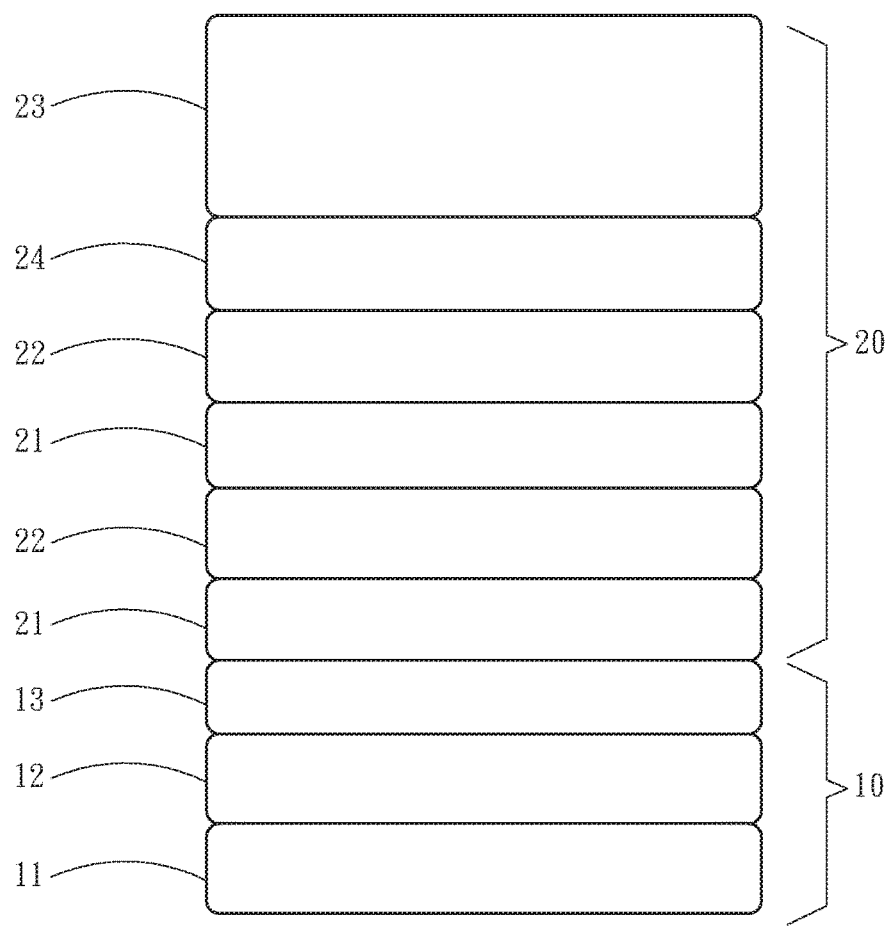
FIG. 2 is a schematic diagram of an LED of the present invention.

FIG. 2 shows a schematic diagram of an electrode structure of a light emitting diode (LED) of the present invention. The electrode structure, applied to an LED (not shown), includes an adhesion layer 10 and a bond pad layer 20. The adhesion layer 10 is stacked on the LED, and the bond pad layer 20 is stacked on the adhesion layer 10. The electrode structure is characterized that, the bond pad layer 20 includes at least two first metal layers 21, at least two second metal layers 22 and an outermost gold layer 23 that are sequentially and alternately stacked. The first metal layers 21 are selected from the group consisting of aluminum (Al) and an aluminum alloy. The second metal layers 22 are selected from the group consisting of titanium (Ti), nickel (Ni), chromium (Cr), platinum (Pt), palladium (Pd), titanium nitride (TiN), titanium wolfram (TiW), wolfram (W), rhodium (Rh) and copper (Cu).

The bond pad layer 20 may further include a platinum layer 24, which is between the second metal layer 22 and the gold layer 23. The adhesion layer 10 may include a chromium layer 11, and may further include an aluminum layer 12 and a titanium layer 13 sequentially stacked on the chromium layer 11. The adhesion layer 10 is attached on the N-type semiconductor layer or P-type semiconductor layer of the LED to prevent the electrode layer from detaching.

Thus, the electrode structure may serve as an N-type electrode or a P-type electrode of the LED.

Figure 3:
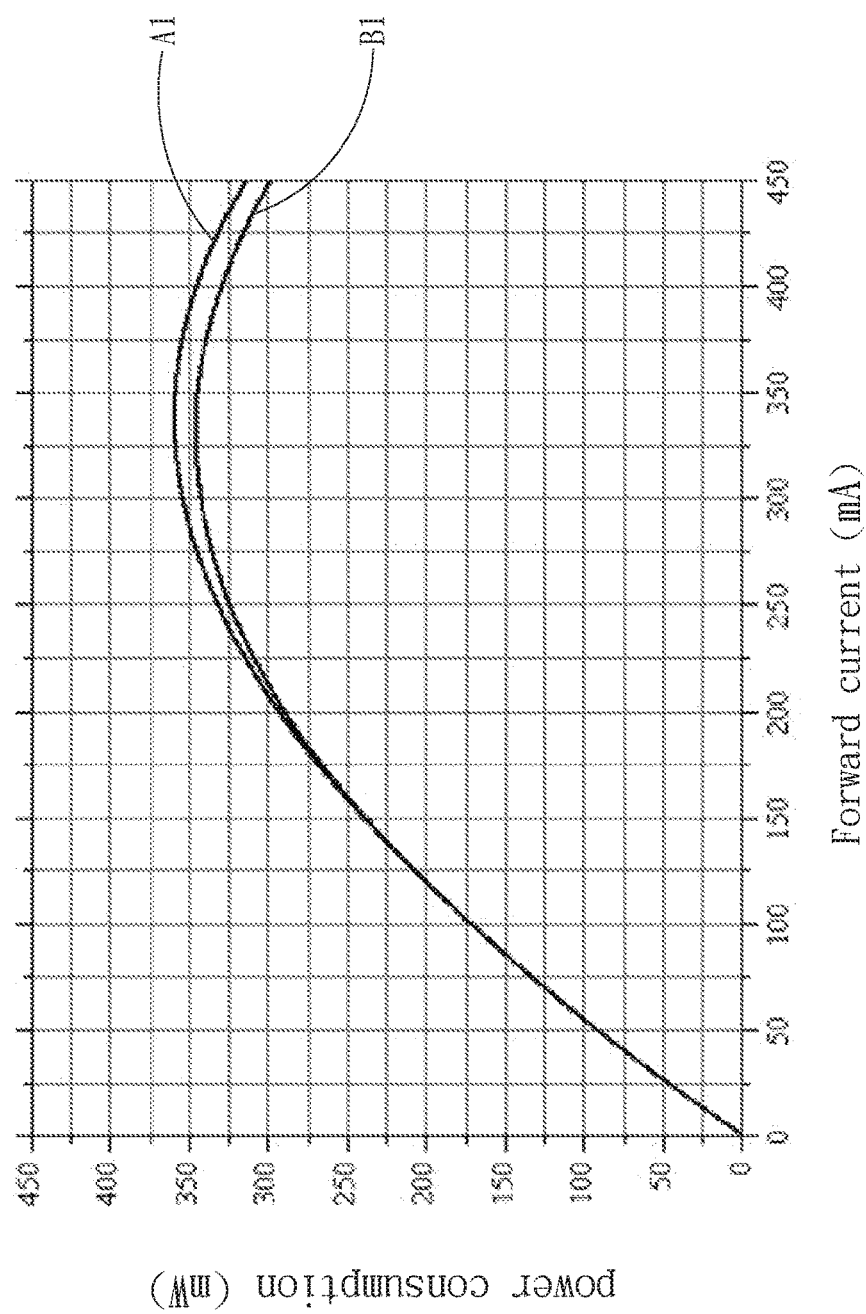
FIG. 3 is a comparison diagram of power consumptions of the present invention and a conventional electrode structure.
Figure 4:
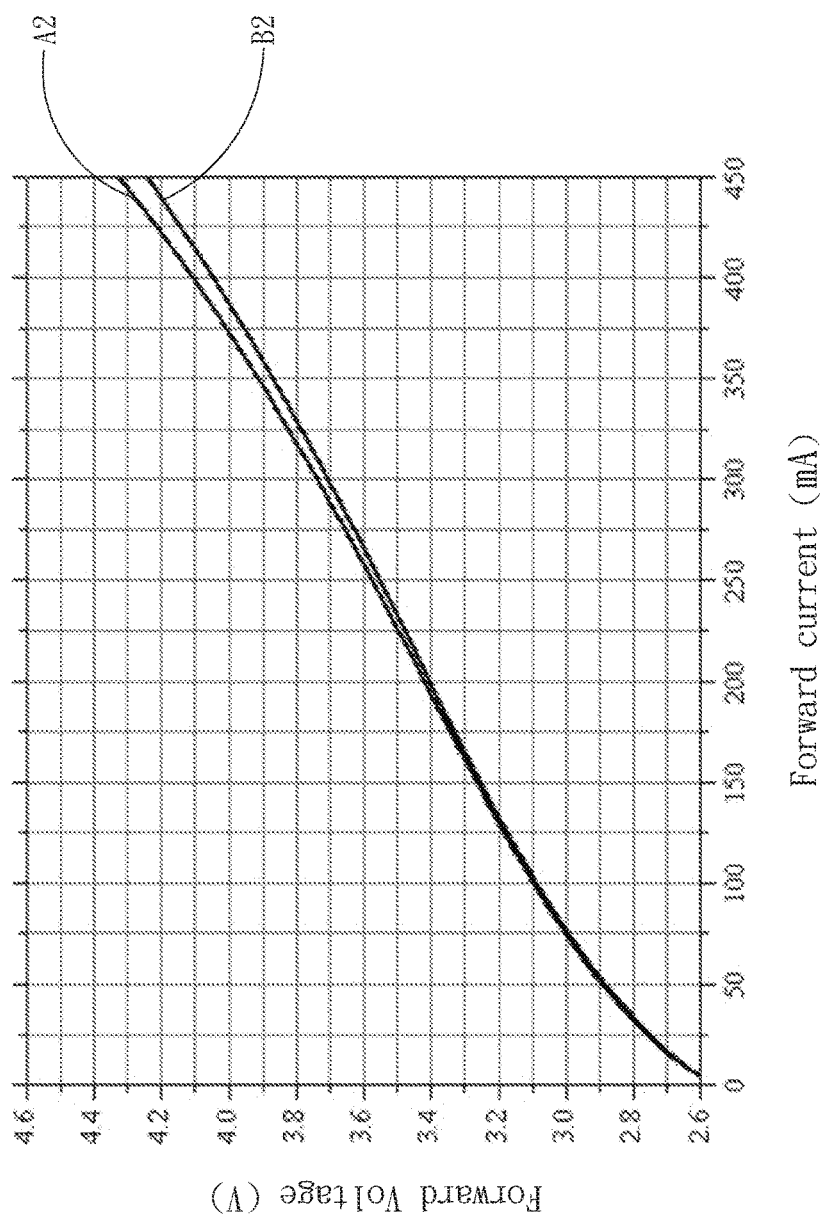
FIG. 4 is a comparison diagram of forward voltages of the present invention and a conventional electrode structure.
Figure 5:
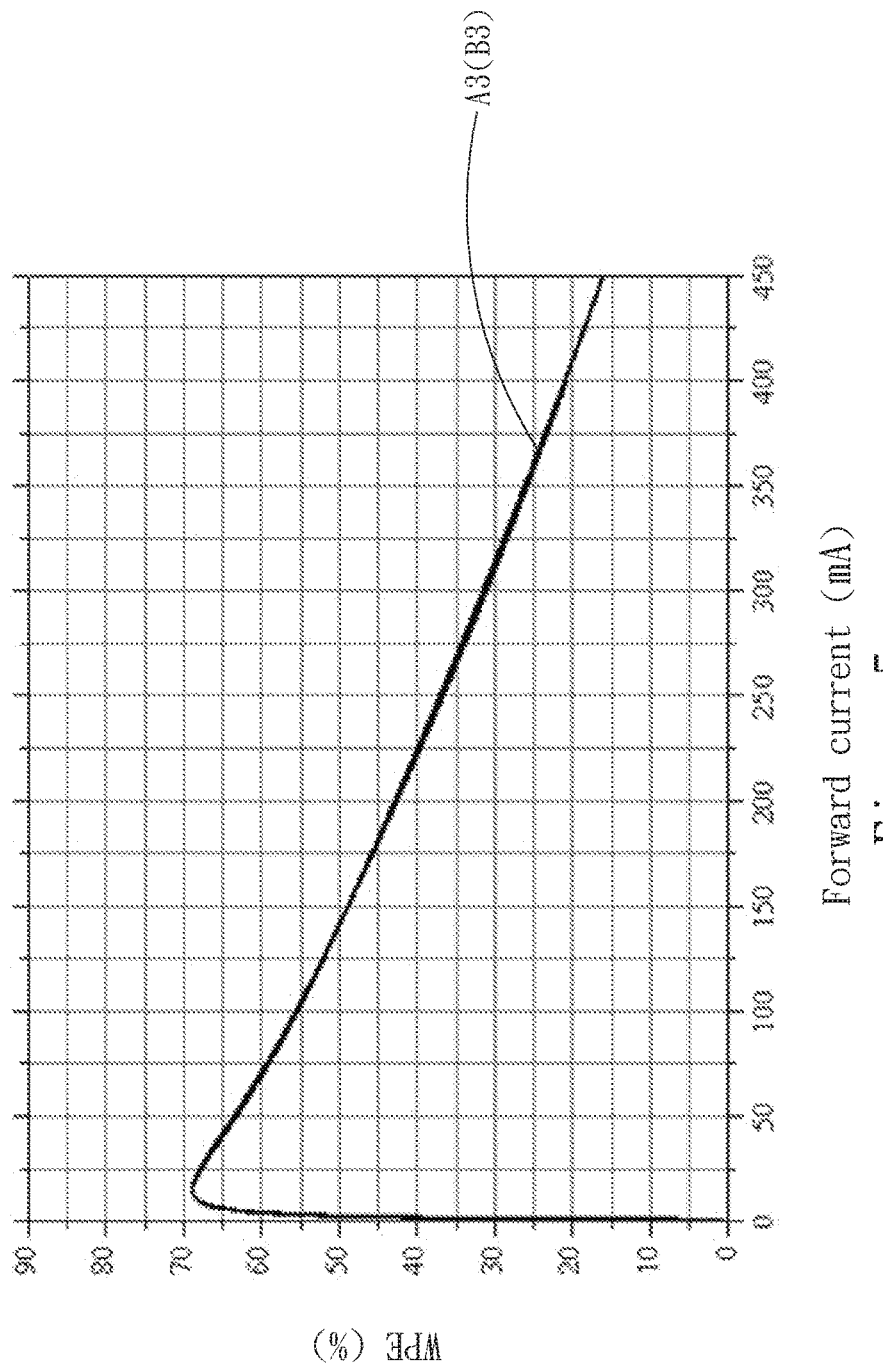
FIG. 5 is a comparison diagram of wall-plug efficiencies of the present invention and a conventional electrode structure.

Referring to FIG. 3, FIG. 4 and FIG. 5 showing comparison diagrams between performances of the electrode structure of the present invention and a conventional electrode structure. The adhesion layer 10 and the bond pad layer 20 of the electrode structure of the present invention are as shown in FIG. 2. In one embodiment of the present invention, thicknesses and materials of the layers are as follows. In the adhesion layer 10, the chromium layer 11 of has a thickness of 18 angstroms (Å), the aluminum layer 12 has a thickness of 2500 Å, and the titanium layer 13 has a thickness of 500 Å. The first metal layers 21 and the second metal layers 22 are Al and Ti, respectively, wherein Al has a thickness of 10000 Å, and Ti has a thickness of 500 Å. In the bond pad layer 20, the platinum layer 24 has a thickness of 400 Å, and the gold layer 23 has a thickness of 2000 Å.

Figure 1:
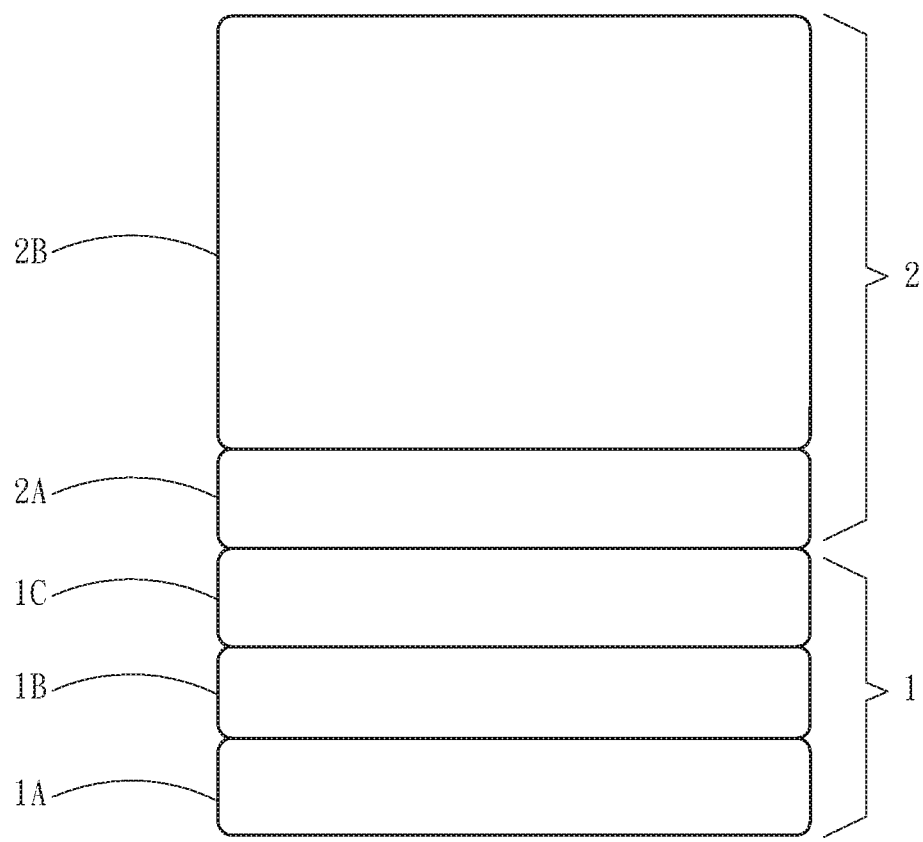
FIG. 1 is a schematic diagram of an electrode structure of a conventional light emitting diode (LED)

Again referring to FIG. 1, for the conventional structure, the thicknesses of the layers are as follows. The chromium layer has a thickness of 18 Å, the aluminum layer has a thickness of 2500 Å, the titanium layer has a thickness of 500 Å, the platinum layer has a thickness of 400 Å, and the gold layer has a thickness of 18000 Å.

The electrode structure of the present invention and the foregoing conventional electrode structure are respectively used as N-type electrodes and P-type electrodes of an LED, and comparison diagrams of curves of power consumptions, forward voltages and wall-plug efficiencies (WPE) measured under different forward currents are obtained. In the drawings, the curves of the electrode structure of the present invention are A1, A2 and A3, and the curves of the conventional electrode structure are B1, B2 and B3.

As seen from FIG. 3, concerning power consumption, the curve A1 of the electrode structure of the present invention is almost the same as the curve B1 of the conventional electrode structure under a low forward current, and the power consumption of the electrode structure of the present invention increases slightly as the forward current increases, with however a limited difference between the two.

As seen from FIG. 4, concerning forward voltage, the curve A2 of the electrode structure of the present invention is almost the same as the curve B1 of the conventional electrode structure under a low forward current, and the forward voltage of the electrode structure of the present invention increases slightly as the forward current increases, with however still a limited difference between the two.

As seen from FIG. 5, concerning wall-plug efficiency, the curve A3 of the electrode structure of the present invention is almost identical to the curve B3 of the conventional electrode structure.

In conclusion, in the present invention, the main structure of the bond pad layer, being a stacked structure formed by the first metal layers and the second metal layers, improves the issues of inadequate hardness for wire bonding and electromigration and significantly reduces the amount of gold used. As opposed to a conventional structure, as shown in FIG. 3 to FIG. 5, optoelectronic characteristics between the two do not differ much. However, the embodiments of the present invention save a 13000-Å-thick gold layer, and at the same time adds in a 1000-Å-thick titanium layer and a 2000-Å-thick aluminum layer. Considering the price differences of these metals, production costs can be reduced to satisfy manufacturing needs.

What is claimed is:

1. An electrode structure of a light emitting diode (LED), applied to the LED, comprising an adhesion layer and a bond pad layer, the adhesion layer stacked on the LED, the bond pad layer stacked on the adhesion layer, the electrode structure being characterized that:
   the bond pad layer comprises at least two first metal layers, at least two second metal layers and an outermost gold layer that are alternately and sequentially stacked, the first metal layers are selected from the group consisting of aluminum (Al) and an aluminum alloy, and the second layers are selected from the group consisting of titanium (Ti), nickel (Ni), chromium (Cr), platinum (Pt), palladium (Pd), titanium nitride (TiN), titanium wolfram (TiW), wolfram (W), rhodium (Rh) and copper (Cu);
   wherein the bond pad layer further comprises a platinum layer, which is between the second metal layer of the bond pad layer and the gold layer of the bond pad layer.

2. The electrode structure of an LED of claim 1, wherein the adhesion layer comprises a chromium layer.

3. The electrode structure of an LED of claim 2, wherein the adhesion layer further comprises an aluminum layer and a titanium layer sequentially stacked on the chromium layer.

4. The electrode structure of an LED of claim 3, wherein in the adhesion layer, the chromium layer has a thickness of 18 Å, the aluminum layer has a thickness of 2500 angstrom (Å), and the titanium layer has a thickness of 500 Å.

5. The electrode structure of an LED of claim 1, wherein materials of the first metal layers and the second metal layers are aluminum and titanium, respectively, the aluminum has a thickness of 10000 Å, and the titanium has a thickness of 500 Å.

6. The electrode structure of an LED of claim 1, wherein the bond pad layer, the platinum layer has a thickness of 400 Å and the gold layer has a thickness of 2000 Å.

* * * * *